(12) United States Patent
Wu et al.

(10) Patent No.: US 12,358,481 B2
(45) Date of Patent: Jul. 15, 2025

(54) CONTROL UNIT FOR ELECTROMECHANICAL BRAKE SYSTEMS

(71) Applicant: Haldex Brake Products Aktiebolag, Landskrona (SE)

(72) Inventors: Gang Wu, Shanghai (CN); Anders Lindqvist, Landskrona (SE); Anders Nilsson, Landskrona (SE); Zenglai Song, Shanghai (CN); Xianbin Dong, Shanghai (CN)

(73) Assignee: Haldex Brake Products Aktiebolag, Landskrona (SE)

( * ) Notice: Subject to any disclaimer, the term of this patent is extended or adjusted under 35 U.S.C. 154(b) by 249 days.

(21) Appl. No.: 18/097,214

(22) Filed: Jan. 14, 2023

(65) Prior Publication Data

US 2023/0150465 A1 May 18, 2023

Related U.S. Application Data

(63) Continuation of application No. PCT/EP2021/069772, filed on Jul. 15, 2021.

(30) Foreign Application Priority Data

Jul. 16, 2020 (CN) .......................... 202010686690.6

(51) Int. Cl.
*G06F 1/16* (2006.01)
*B60T 13/74* (2006.01)
(Continued)

(52) U.S. Cl.
CPC .............. *B60T 13/74* (2013.01); *B60T 17/00* (2013.01); *H05K 7/1427* (2013.01)

(58) Field of Classification Search
CPC ...... B60T 13/74; B60T 17/00; B60T 2270/82; H05K 7/1427; B60G 2800/92
See application file for complete search history.

(56) References Cited

U.S. PATENT DOCUMENTS

| 10,432,016 B2 | 10/2019 | Brookfield |
| 2008/0158823 A1* | 7/2008 | Tominaga ............ H05K 5/0043 |
| | | 361/709 |

(Continued)

FOREIGN PATENT DOCUMENTS

| CN | 107 618 496 A | 1/2018 | |
| JP | 2005094943 A * | 4/2005 | ............. B60L 50/40 |
| WO | 2019007122 A1 | 1/2019 | |

OTHER PUBLICATIONS

JP 2005094943A translation (Year: 2005).*
International Search Report and Written Opinion for copending application PCT/EP2021/069772, dated Oct. 28, 2021.

*Primary Examiner* — Anthony M Haughton
(74) *Attorney, Agent, or Firm* — Price Heneveld LLP

(57) ABSTRACT

A control unit for electromechanical brake system is provided, which relates to vehicle brake technology. The present invention facilitates the assembling of braking energy storage module and brake system control module and improves the heat dissipation, structural strength, anti-vibration and compactness of the control unit. The control unit comprises: a housing; and a frame plate, a braking energy storage module and a brake system control module, which are configured in the housing, wherein the braking energy storage module and the brake system control module are respectively arranged at two opposite sides of the frame plate.

16 Claims, 2 Drawing Sheets

(51) Int. Cl.
  *B60T 17/00*  (2006.01)
  *H05K 5/00*  (2025.01)
  *H05K 7/00*  (2006.01)
  *H05K 7/14*  (2006.01)

(56) References Cited

U.S. PATENT DOCUMENTS

| | | | |
|---|---|---|---|
| 2010/0243388 A1* | 9/2010 | Holzwarth | B60T 8/885 |
| | | | 188/158 |
| 2019/0222111 A1* | 7/2019 | Noppakunkajorn | H01G 4/306 |
| 2021/0025466 A1* | 1/2021 | Wu | F16D 65/18 |
| 2021/0025467 A1* | 1/2021 | Wu | F16D 65/18 |
| 2021/0170905 A1* | 6/2021 | Cho | B60L 58/12 |
| 2022/0314950 A1* | 10/2022 | Nilsson | B60T 13/746 |

* cited by examiner

CONTROL UNIT FOR ELECTROMECHANICAL BRAKE SYSTEMS

CROSS REFERENCE TO RELATED APPLICATIONS

This application is a continuation of International Application PCT/EP2021/069772 with an international filing date of Jul. 15, 2021 and claiming priority to co-pending Chinese Patent Application No. CN 202010686690.6 entitled "Control unit for electromechanical brake systems", filed on Jul. 16, 2020.

FIELD OF THE INVENTION

Embodiments of the present disclosure relate to vehicle brake technology, and more particularly relate to a control unit for electromechanical brake systems.

BACKGROUND OF THE INVENTION

Existing electromechanical brake (EMB) systems mainly comprise a control unit, an electronic brake actuator, and a braking request input device (e.g., an electronic brake pedal and an EPB (electronic parking brake) switch). To perform service braking, when the driver steps on the electronic brake pedal, the electronic brake pedal simulates the non-linear tactile feedback of a pneumatic/hydraulic brake system, meanwhile detects the pedal stroke and/or pedal force, and synchronously transmits a pedal stroke signal to the control unit; the control unit parses the pedal stroke signal, identifies the driver's braking intention, and controls the electronic brake actuator to actuate the calipers to produce a corresponding brake force, thereby implementing braking.

In the electromechanical brake system, the braking energy comes from the mechanical energy converted from electric power, while the electric power is originated from an in-vehicle or on-board battery or generator, or from a power battery in the case of an electric vehicle. In an optional power supply architecture of the electromechanical brake system, an energy storage module is provided between the in-vehicle power supply and the electronic brake actuator so as to enhance system reliability, wherein the energy storage module, which is charged by the in-vehicle power supply, only supplies power to the electromechanical brake system, such that a voltage higher than that supplied by the in-vehicle power supply may be applied to the brake system of a vehicle (especially a commercial vehicle), and even upon failure of the in-vehicle power supply, the vehicle can still be braked to stop with the power supplied by the energy storage module.

Further prior art is described in U.S. Pat. No. 10,432,016 B2, Chinese patent application No. CN 107 618 496 A and international patent application WO 2019/007122 A1.

SUMMARY OF THE INVENTION

Embodiments of the present disclosure provide an electromechanical brake system control unit integrated with an energy storage module, which simplifies system architecture and connection circuitry, and offers good performance in environment protection, heat dissipation, and electromagnetic interference resistance. Embodiments of the present application present the following technical solutions:

A control unit for electromechanical brake systems comprises:
a housing; and
a frame plate, a braking energy storage module and a brake system control module, which are configured in the housing, wherein the braking energy storage module and the brake system control module are respectively arranged at two opposite sides of the frame plate.

With the novel control unit for electromechanical brake systems it is in particular possible to simplify the system architecture and connection circuitry and to offer good performance in environment protection, heat dissipation, and electromagnetic interference resistance.

In at least one embodiment of the control unit for electromechanical brake systems, the braking energy storage module is fixed between the frame plate and an inner wall of the housing, and the brake system control module is fixedly connected to the frame plate or an inner wall of the housing.

In at least one embodiment of the control unit for electromechanical brake systems, the braking energy storage module comprises a power management circuit board; and a plurality of energy storage cells configured on the power management circuit board, the power management circuit board being fixedly connected to the frame plate.

In at least one embodiment of the control unit for electromechanical brake systems, a thermal pad is provided between the energy storage cells and an inner wall of the housing.

In at least one embodiment of the control unit for electromechanical brake systems, a thermally conductive medium and/or a shock absorbing medium are provided between the braking energy storage module and the frame plate and/or between the brake system control module and the frame plate.

In at least one embodiment of the control unit for electromechanical brake systems, a voltage conversion module is further provided in the housing, the voltage conversion module and the brake system control module being arranged at the same side of the frame plate.

In at least one embodiment of the control unit for electromechanical brake systems, the braking energy storage module is in signal or electric connection with the brake system control module and/or the voltage conversion module via a board-to-board connector, a cable, or a bus, the board-to-board connector, the cable, or the bus passing through the frame plate.

In at least one embodiment of the control unit for electromechanical brake systems, the bus is supported on a dielectric stand, the dielectric stand being fixed to the frame plate.

In at least one embodiment of the control unit for electromechanical brake systems, the control unit further comprises an input connector configured for an external power supply to input power, and an output connector configured for outputting power to an electronic brake device.

In at least one embodiment of the control unit for electromechanical brake systems, a plurality of support units are provided in the housing, and through-holes are provided respectively in the frame plate, the braking energy storage module, and the brake system control module, whereby the frame plate, the braking energy storage module, and the brake system control module are stacked and fastened to the support units by bolts through the through-holes.

The present disclosure offers the following beneficial effects:

According to various embodiments of the control unit for electromechanical brake systems provided by the present disclosure, the braking energy storage module and the brake system control module are arranged at the opposite sides of a same frame plate, such that the braking energy storage module and the brake system control module are compactly mounted in the housing of the control unit, which avoids process, installation, and expense issues that arise from separately mounting, and a stronger adaptability is offered with respect to the internal space of the housing, which saves the mounting space and thus reduces the size of the control unit; alternatively, the saved space is usable for mounting other components.

In the present disclosure, the frame plate might not only serve as a carrier for mounting the braking energy storage module and the brake system control module, but in some cases also serves as a heat dissipation medium therefor so as to enhance their heat dissipation effect. More specifically, the heat produced by the braking energy storage module and the brake system control module during operation can be conducted to the frame plate, which enhances heat dissipation (e.g., by increasing the heat dissipation area, or by conducting the heat to the housing via the frame plate, such that the heat is released to the outside via the frame plate). Compared with radiative dissipation, a faster heat dissipation rate is achieved with the frame plate as the heat dissipation medium; as a result, the braking energy storage module and the brake system control module maintain a relatively low temperature rise during operation.

Further, the braking energy storage module can be fixed between the frame plate and a inner wall of the housing. In this way, an additional fixing part can be eliminated for fixing the braking energy storage module in the control unit, which saves expense.

Further, the braking energy storage module preferably comprises a power management circuit board; and a plurality of energy storage cells configured on the power management circuit board, the power management circuit board being fixedly connected to the frame plate. The power management circuit board can be configured to warrant voltage balancing among the plurality of energy storage cells during charging and alleviate voltage imbalance among some energy storage cells; with the power management circuit board, the frame plate applies a uniform pressure on the plurality of energy storage cells, thereby effectively fixing the plurality of energy storage cells.

Further, preferably a thermal pad is provided between the energy storage cells and a inner wall of the housing. The thermal pad mainly might plays the following roles: first, its good heat conductivity accelerates heat conduction from the energy storage cells to the inner wall of the housing, which improves heat dissipation efficiency; second, it also offers a good elastic compressive property for absorbing vibration energy and external shock and is configured for providing elastic support for the energy storage cells, fixing the energy storage cells more securely, avoiding collision between the energy storage cells and the housing, and warranting reliability of the electrical connection between the energy storage cells and the power management circuit board; third, also thanks to its elastic compressive property, the assembly tolerance of the braking energy storage module may be compensated through compression of the thermal pad, avoiding looseness of the energy storage cells due to assembly tolerance, or deformation of the power management circuit board due to excess tightening, or damages to the weld spots of the energy storage cells.

Further, preferably a thermally conductive medium and/or a shock absorbing medium are provided between the braking energy storage module and the frame plate and/or between the brake system control module and the frame plate. With the thermally conductive medium arranged between the brake system control module and the frame plate, the good thermally conductive property of the thermally conductive medium accelerates heat conduction from the brake system control module to the frame plate, thereby improving heat dissipation efficiency; alternatively, with the shock absorbing medium arranged between the brake system control module and the frame plate, the shock absorbing medium may absorb vibration energy, thereby alleviating vibration impact on the brake system control module, so does the arrangement of the thermally conductive medium and/or shock absorbing medium between the braking energy storage module and the frame plate.

Further, preferably a voltage conversion module is further provided in the housing, the voltage conversion module and the brake system control module being fixed to the same side of the frame plate. The voltage conversion module can be configured to convert the voltage of the external power supply to a voltage adapted for operation of the brake system control module; the voltage conversion module and the brake system control module can be fixed to the same side of the frame plate; the voltage conversion module can be securely supported by the frame plate; as such, electrical connection between the voltage conversion module and the brake system control module is facilitated.

Further, preferably a plurality of support units are provided in the housing, and corresponding through-holes are provided respectively in the frame plate, the braking energy storage module, and the brake system control module, whereby the frame plate, the braking energy storage module, and the brake system control module are stacked and fastened to the support units by bolts through the through-holes. By fixedly stacking the frame plate, the brake system control module, and the braking energy storage module, the assembled size for the three is reduced as much as possible; the more compact architecture facilitates one-time fixing of them within the housing with the bolts, thereby facilitating assembly.

These characteristics and advantages of the present disclosure will be disclosed in detail in the preferred embodiments below with reference to the accompanying drawings.

Advantageous developments of the invention result from the claims, the description and the drawings.

The advantages of features and of combinations of a plurality of features mentioned at the beginning of the description only serve as examples and may be used alternatively or cumulatively without the necessity of embodiments according to the invention having to obtain these advantages.

The following applies with respect to the disclosure—not the scope of protection—of the original application and the patent: Further features may be taken from the drawings, in particular from the illustrated designs and the dimensions of a plurality of components with respect to one another as well as from their relative arrangement and their operative connection. The combination of features of different embodiments of the invention or of features of different claims independent of the chosen references of the claims is also possible, and it is motivated herewith. This also relates to features which are illustrated in separate drawings, or which are mentioned when describing them. These features may also be combined with features of different claims. Furthermore, it is possible that further embodiments of the invention do not have the features mentioned in the claims which, however, does not apply to the independent claims of the granted patent.

The number of the features mentioned in the claims and in the description is to be understood to cover this exact number and a greater number than the mentioned number without having to explicitly use the adverb "at least". For example, if an element is mentioned, this is to be understood such that there is exactly one element or there are two elements or more elements. Additional features may be added to these features, or these features may be the only features of the respective product.

The reference signs contained in the claims are not limiting the extent of the matter protected by the claims. Their sole function is to make the claims easier to understand.

Other features and advantages of the present invention will become apparent to one with skill in the art upon examination of the following drawings and the detailed description. It is intended that all such additional features and advantages be included herein within the scope of the present invention, as defined by the claims.

BRIEF DESCRIPTION OF THE DRAWINGS

Hereinafter, the present disclosure will be described in further detail with reference to the accompanying drawings.

DETAILED DESCRIPTION

Embodiments of the present disclosure provide a control unit for electromechanical brake system, comprising: a housing; and a frame plate, a braking energy storage module and a brake system control module, which are configured in the housing, wherein the braking energy storage module and the brake system control module are respectively placed at two opposite sides of the frame plate. The braking energy storage module and the brake system control module are compactly mounted in the housing of the control unit; such an arrangement avoids process and expense issues arising from separately mounting of the two, offers a higher adaptability to the internal space of the housing, saves the mounting space, and reduces the size of the control unit; alternatively, the saved space is usable for mounting other devices. Besides, the frame plate also serves as a heat dissipation medium for the braking energy storage module and the brake system control module so as to realize conductive heat dissipation and offer a higher heat dissipation rate; as a result, the braking energy storage module and the brake system control module still maintain a relatively low temperature rise during operation.

Hereinafter, the technical solutions of the embodiments of the present disclosure will be explained and illustrated with reference to the accompanying drawings. However, the embodiments are only preferred embodiments of the present disclosure, not all of them. Other embodiments derived by those skilled in the art without exercise of inventive work based on the examples in the embodiments all fall within the protection scope of the present disclosure.

In the present disclosure, unless otherwise explicitly provided and limited, the terms such as "mounting", "connected", "connection", and "fixing" or their variables should be understood broadly, which, for example, may refer to a secured connection, a detachable connection, or an integrated connection, which may be a mechanical connection or an electrical connection, which may be a direct connection or an indirect connection via an intermediate agent, and which may further be a communication between the insides of two elements. To a person of normal skill in the art, specific meanings of the above terms in the present disclosure may be construed dependent on specific situations.

Figure 1:
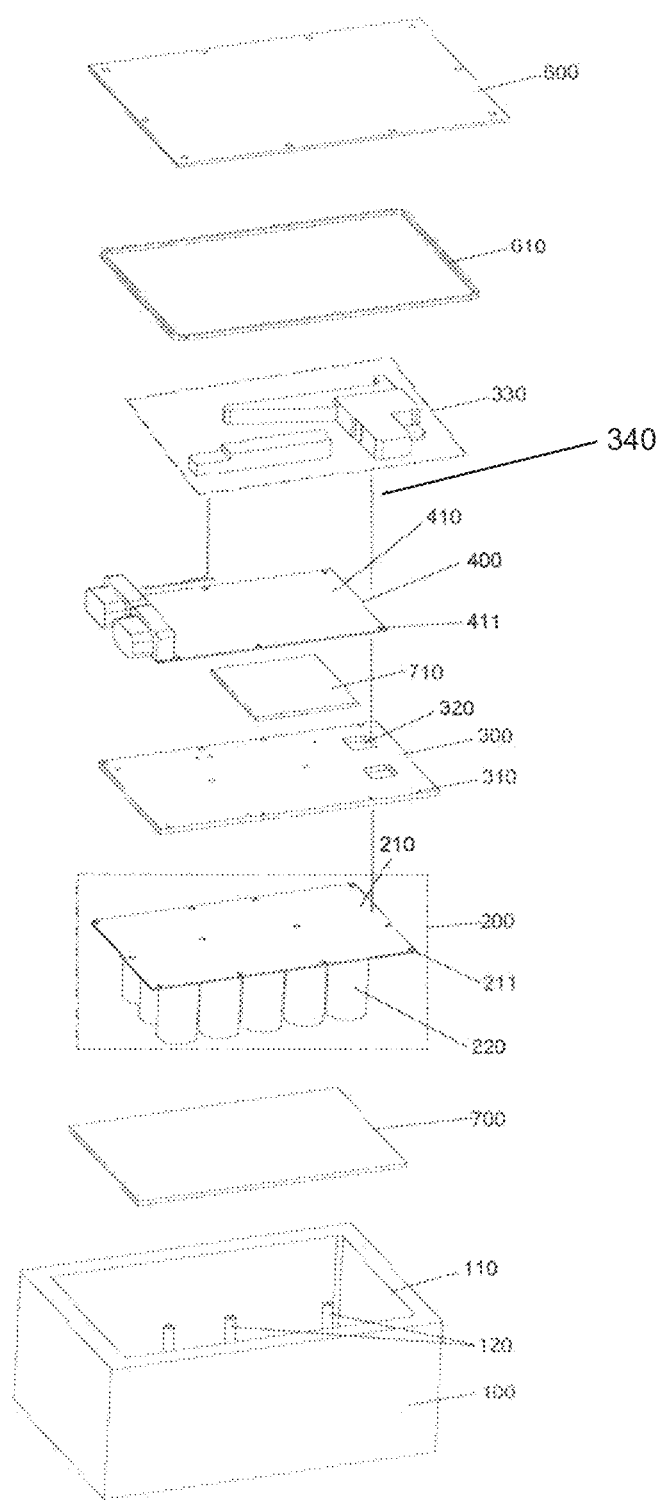
FIG. 1 shows an exploded view of a control unit in one embodiment of the present disclosure.
Figure 2:
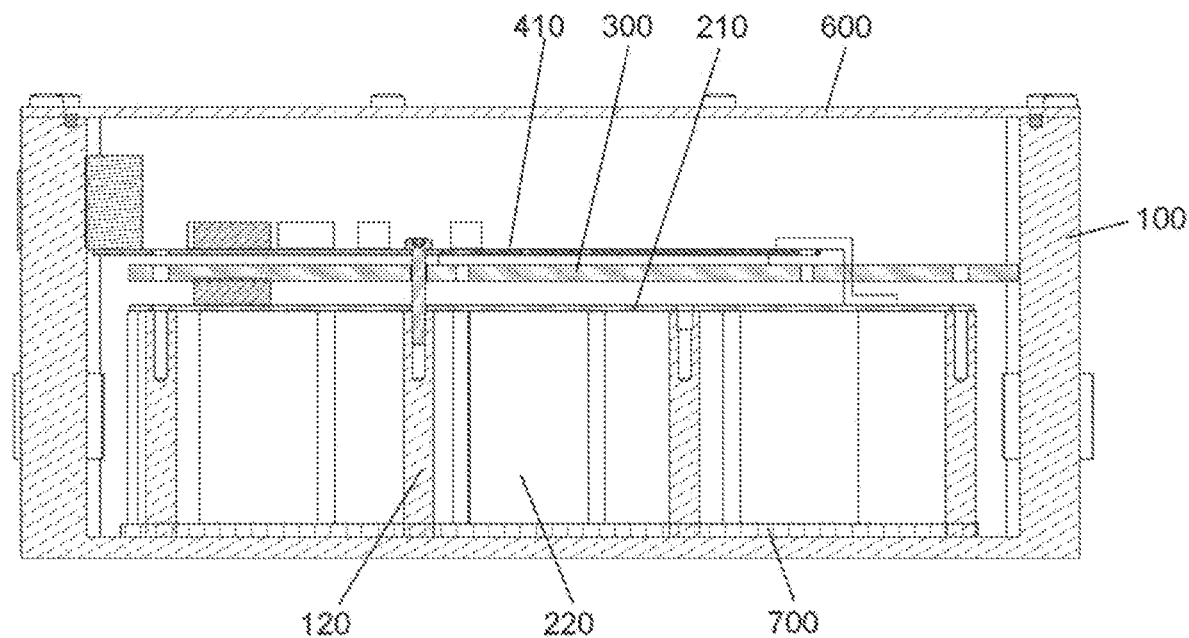
FIG. 2 is a sectional view of a control unit in one embodiment of the present disclosure.

Referring to FIGS. 1 and 2, a control unit for electromechanical brake systems according to one embodiment of the present disclosure comprises a housing 100; and a frame plate 300, a braking energy storage module 200, and a brake system control module 400, which are configured in the housing 100; the braking energy storage module 200 and the brake system control module 400 are arranged at two opposite sides of the frame plate 300, respectively. The two opposite sides of the frame plate 300 herein refer to two side surfaces of the frame plate 300 in the thickness direction. With the state shown in FIG. 2 as an example, the two opposite sides of the frame plate 300 refer to the upper surface and the lower surface of the frame plate 300, wherein the brake system control module 400 is arranged at the upper surface of the frame plate 300, and the braking energy storage module 200 is fixed to the lower surface of the frame plate 300, such that the braking energy storage module 200 and the brake system control module 400 are compactly mounted in the housing 100 of the control unit, avoiding those process and expense issues caused by separately mounting of the two. The brake system control module 400 can be fixed at the upper side of the frame plate 300 or an inner wall of the housing 100, which can be, for example, the inner side of the cover plate 600.

In view that the braking energy storage module 200 and the brake system control module 400 are fixed to the same frame plate 300, a higher adaptability is offered with respect to the internal space of the housing 100, which saves the mounting space and reduces the size of the control unit; alternatively, the saved space is usable for mounting other devices. As shown in FIG. 2, the frame plate 300, the braking energy storage module 200, and the brake system control module 400 are stacked and fixed in the housing 100, which enables reduction of the assembled size of the three as much as possible, thereby saving more space.

In this embodiment, the frame plate 300 not only serves as a carrier for mounting the braking energy storage module 200 and the brake system control module 400, but also serves as a heat dissipation medium therefor so as to enhance heat dissipation for the braking energy storage module 200 and the brake system control module 400. The heat produced by the braking energy storage module 200 and the brake system control module 400 during operation is conducted to the frame plate 300 via which heat is dissipated to the outside (e.g., the frame plate 300 conducts heat to the housing 100 via which the heat is released outside). Compared with radiative dissipation, a faster heat dissipation rate is achieved with the frame plate 300 as the heat dissipation medium, such that the braking energy storage module 200 and the brake system control module 400 maintain a relatively low temperature rise during operation. The frame plate 300 is preferably made of a metal material with a good thermally conductive property, such as aluminum, copper, aluminum alloy, etc.; the metal frame plate 300 has a high structural strength, such that it is not only enabled to reliably support the braking energy storage module 200 and the brake system control module 400, but also enhances heat dissipation.

Hereinafter, detailed illustration will be made with respect to the assembly and connection structure and the electrical connection structure with respect to the frame plate 300, the braking energy storage module 200, and the brake system control module 400 in the embodiments:

Assembly and Connection Structure

Corresponding through-holes are provided respectively in the frame plate 300, the braking energy storage module 200, and the brake system control module 400, whereby the frame plate 300, the braking energy storage module 200, and the brake system control module 400 are stacked and fastened to the support units of the housing 100 by bolts through respective through-holes. In one exemplary embodiment, referring to FIGS. 1 and 2, a plurality of first through-holes 310 are arranged along the perimeter of the frame plate 300; the brake system control module 400 comprises a control circuit board 410 and a control circuit configured on the control circuit board 410, wherein a plurality of second through-holes 411 are arranged along the perimeter of the control circuit board 410; the braking energy storage module 200 comprises a power management circuit board 210 and a plurality of energy storage cells configured on the power management circuit board 210, wherein a plurality of third through-holes 211 are arranged along the perimeter of the power management circuit board; the first through-holes 310, the second through-holes 411, and the third through-hole 211 are arranged in alignment with one another; an opening 110 is provided on the upper end of the housing 100, and a plurality of support units 120 are formed by upward extension from the bottom inner wall inside the housing 100.

Continued with the above depictions, to assemble them, the braking energy storage module 200, the frame plate 300, and the brake system control module 400 are sequentially placed into the housing 100 via the opening 110; the support unit 120 is supported against the lower surface of the power management circuit board 210; the bolts sequentially pass through the second through holes 411, the first through holes 310, and the third through holes 211 and are then fastened to the support unit 120; the frame plate 300, the braking energy storage module 200, and the brake system control module 400 are one-time fixed in the housing 100, which saves assembly procedures and expense; finally, the opening 110 of the housing 100 is sealed with a cover plate 600, wherein the cover plate and the opening 110 of the housing 100 are hermetically fitted via a sealing ring 610.

The assembly and connection structure with respect to the frame plate 300, the braking energy storage module 200, and the brake system control module 400 is not limited to the scheme above. In other embodiments of the present disclosure, the frame plate 300 and the braking energy storage module 200 are made into one modular assembly which is then assembled with the brake system control module 400; or, the frame plate 300 and the brake system control module 400 are made into one modular assembly which is then assembled with the brake energy storage module 200; the fixing manner is not limited to the bolt connection either; in some embodiments, the fixing manner is a combination of snap-fittings and bolts, or tight pressing with other ancillary connectors, etc.

Electrical Connection Structure

The braking energy storage module 200 is in signal or electric connection with the brake system control module 400 via a bus 340 passing through the frame plate 300. In an exemplary embodiment, referring to FIGS. 1 and 2, a dielectric stand 330 and a bus avoidance hole 320 are provided on the frame plate 300; the bus 340 is embedded in the dielectric stand 330; the bus 340 passes through the bus avoidance hole 320 to electrically connect the control circuit board 410 and the power management circuit board 210 to thereby implement transmitting of power or signals between the control circuit board 410 and the power management circuit board 21 0; arrangement of the dielectric stand 330 protects and supports the bus 340 and achieves a reliable electric insulation.

In other embodiments, the electric connection between the braking energy storage module 200 and the brake system control module 400 may also be implemented via a board-to-board connector or a cable.

The energy storage cells 220 in this embodiment are supercapacitors, and a plurality of supercapacitors are connected in an array on the power management circuit 210; the brake system control module 400 is configured to control charge and discharge of the supercapacitors; the power management circuit board 210 is configured to warrant voltage balance between the plurality of supercapacitors during charging, thereby alleviating voltage imbalance among some supercapacitors.

In other embodiments, the energy storage cells 220 may also be other types of capacitive elements or other devices with a power storage function.

In one embodiment of the present disclosure, based on the control unit described above: the brake system control module is fixed to the upper surface of the frame plate, the energy storage cells of the braking energy storage module are fixed to the lower surface of the frame plate, and the power management circuit board is partitioned from the frame plate by the energy storage cells, i.e., the energy storage cells are fixedly held between the power management circuit board and the frame plate; the scheme illustrated in this embodiment also achieves the technical effect of the preceding embodiments.

Referring to FIGS. 1 and 2, in one embodiment of the present disclosure, based on the control unit disclosed in the preceding embodiments: the braking energy storage module 200 is fixed between the frame plate 300 and an inner wall of the housing 100, such that an additional fixing part is eliminated to fix the braking energy storage module 200 in the control unit, thereby saving expense. In an exemplary embodiment, in conjunction with the assembly and connection structure described in the preceding embodiment, the braking energy storage module 200 is installed in a top-down manner in the housing 100; after the assembly work is accomplished, the braking energy storage module 200 is fixedly connected between the frame plate 300 and the bottom inner wall of the housing 100.

When the power management circuit board 210 is fixedly connected to the frame plate 300, the frame plate 300 uniformly applies pressure via the power management circuit board 210 against the plurality of energy storage cells 220, thereby effectively fixing the plurality of energy storage cells 220. A thermal pad 700 is provided between the energy storage cells 220 and the bottom inner wall of the housing 100; the good thermally conductive property of the thermal pad 200 facilitates heat conduction from the energy storage cells 220 to the inner wall of the housing 100, thereby enhancing heat dissipation efficiency; the thermal pad 700 also has a good elastic compressive property for absorbing vibration energy and buffering external impact and is configured for providing elastic support for the energy storage cells 220, fixing the energy storage cells 220 more securely, avoiding collision between the energy storage cells 220 and the housing 110, and warranting reliability of the electrical connection between the energy storage cells 220 and the power management circuit board 210.

Also thanks to the elastic compressive property of the thermal pad 700, the assembly tolerance of the braking energy storage module 200 is compensated by compressing the thermal pad 700 during assembly, avoiding looseness of the energy storage cells 220 due to assembly tolerance, or deformation of the power management circuit board 210 due to excess tightening. Specifically, in conjunction with the assembly and connection structure as described in the preceding embodiment, if the height of the energy storage cells 220 is lower than that of the support units 120, the energy storage cells 220 cannot be securely held between the frame plate 300 and the bottom inner wall of the housing 100; if the height of the energy storage cells 220 is greater than that of the support units 120, the power management circuit board 210 is easily deformed by being compressed by the energy storage cells 220. With the thermal pad 700 provided between the energy storage cells 220 and the bottom inner wall of the housing 100, the height of the support units 120 is configurable to be lower than that of the energy storage cells 220, such that upon assembly, the energy storage cells 220 compress the thermal pad 700 to thereby neutralize the assembly tolerance (height difference) between the energy storage cells 220 and the support units 120.

In some embodiments, without considering the assembly tolerance, another type of thermally conductive structure is arranged between the energy storage cells 220 and the bottom inner wall of the housing 100 to enhance heat dissipation, e.g., by filling a thermally conductive grease between the energy storage cells 220 and the bottom inner wall of the housing 100.

In one embodiment of the present disclosure, based on the control unit described above: a thermally conductive medium 710, such as a thermal pad, a thermally conductive silicon grease, a thermally conductive adhesive, etc., is arranged between the brake system control module 400 and the frame plate 300 so as to accelerate heat conduction from the brake system control module 400 to the frame plate 300 by leveraging the good thermally conductive property of the thermally conductive medium 710, thereby enhancing heat dissipation efficiency; alternatively, a shock absorbing medium, such as silica gel, rubber, foamed plastics, etc., is further arranged between the brake system control module 400 and the frame plate 300, which absorbs the vibration energy and thus alleviates the vibration impact on the brake system control module 400; in some embodiments, the thermally conductive medium and the shock absorbing medium are integrated into for example an elastic thermal pad, which is securely connected to one of the brake system control module 400 and the frame plate 300, or securely held by the two.

Optionally, the thermally conductive medium and/or the shock absorbing medium are also arranged between the braking energy storage module 200 and the frame plate 300, so as to absorb shock and/or accelerate heat dissipation with respect to the brake energy storage module 200.

Figure 3:
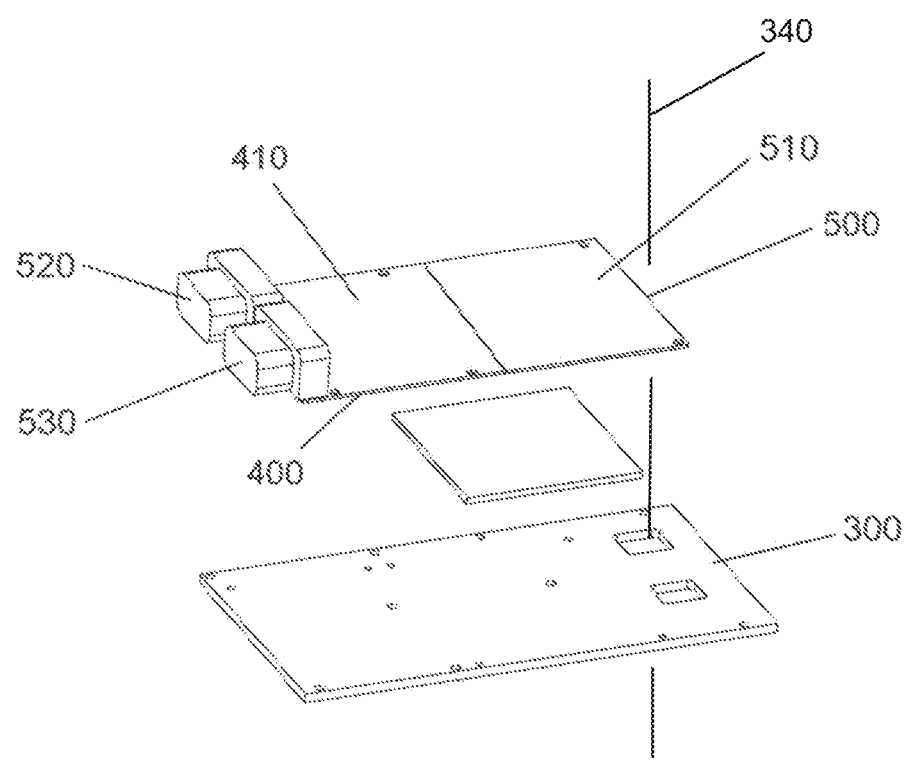
FIG. 3 shows a view of a control unit in one embodiment of the present disclosure.

Referring to FIG. 3, in one embodiment of the present disclosure, based on the control unit described above: a voltage conversion module 500 is further provided in the housing 100, the voltage conversion module 500 and the brake system control module 400 being fixed to the same side of the frame plate 300. In an exemplary embodiment, the voltage conversion module 500 comprises a power circuit board 510 and a voltage conversion circuit configured on the power circuit board 510; the power circuit board 510 is fixed to the upper surface of the frame plate 300 using the assembly and connection structure described above, and the power circuit board 510 is in signal or electric connection with the control circuit board 410 via any one of a board-to-board connector, cable, or bus 340. The control unit in this embodiment further comprises an input connector 530 configured for an external power supply to input power, and an output connector 520 configured to output power to the electronic brake device; the input connector 530 and the output connector 520 are mounted on the power circuit board 510; the voltage conversion module 500 is configured to convert the external power supply voltage to an operating voltage adapted to the brake system control module 400; the voltage conversion module 500 and the brake system control module 400 are fixed to the same side of the frame plate 300; the voltage conversion module 500 is securely supported by the frame plate 300; as such, electrical connection is facilitated between the voltage conversion module 500 and the brake system control module 400.

In some embodiments, the voltage conversion module 500 is in signal or electric connection with the power management circuit board 210 of the brake energy storage module 200 via one of the board-to-board connector, the cable, and the bus 340.

In other embodiments, the voltage conversion module 500 is optionally integrated to the brake system control module 400, i.e., the control circuit and the voltage conversion circuit are both configured on the control circuit board 410, and the power circuit board 510 and the control circuit board 410 are optionally integrated into one circuit board.

What have been described above are only preferred embodiments of the present disclosure; however, the protection scope of the present disclosure is not limited thereto. A person skilled in the art should understand that the present disclosure includes, but is not limited to the contents described in the drawings and the preferred embodiments. Any modifications without departing from the functions and structural principles of the present disclosure will be included within the scope of the claims.

Many variations and modifications may be made to the preferred embodiments of the invention without departing substantially from the spirit and principles of the invention. All such modifications and variations are intended to be included herein within the scope of the present invention, as defined by the following claims.

We claim:

1. A control unit for electromechanical brake systems, comprising:
    a housing;
    a frame plate, a braking energy storage module and a brake system control module, which are configured in the housing, wherein the braking energy storage module and the brake system control module are respectively arranged at two opposite sides of the frame plate, wherein the braking energy storage module comprises a power management circuit board; and
    a plurality of energy storage cells configured on the power management circuit board, the power management circuit board being fixedly connected to the frame plate.

2. The control unit for electromechanical brake systems according to claim 1, wherein the braking energy storage module is fixed between the frame plate and an inner wall of the housing, and the brake system control module is fixedly connected to the frame plate or an inner wall of the housing.

3. The control unit for electromechanical brake systems according to claim 1, wherein a thermal pad is provided between the energy storage cells and an inner wall of the housing.

4. The control unit for electromechanical brake systems according to claim 1, wherein a thermally conductive medium and/or a shock absorbing medium are provided between the braking energy storage module and the frame plate and/or between the brake system control module and the frame plate.

5. The control unit for electromechanical brake systems according to claim 1, wherein a voltage conversion module is further provided in the housing, the voltage conversion module and the brake system control module being arranged at the same side of the frame plate.

6. The control unit for electromechanical brake systems according to claim 5, wherein the braking energy storage module is in signal or electric connection with the brake system control module and/or the voltage conversion module via a board-to-board connector, a cable, or a bus, the board-to-board connector, the cable, or the bus passing through the frame plate.

7. The control unit for electromechanical brake systems according to claim 6, wherein the bus is supported on a dielectric stand, the dielectric stand being fixed to the frame plate.

8. The control unit for electromechanical brake systems according to claim 1, wherein the control unit further comprises an input connector configured for an external power supply to input power, and an output connector configured for outputting power to an electronic brake device.

9. The control unit for electromechanical brake systems according to claim 1, wherein a plurality of support units are provided in the housing, and through-holes are provided respectively in the frame plate, the braking energy storage module, and the brake system control module, whereby the frame plate, the braking energy storage module, and the brake system control module are stacked and fastened to the support units by bolts through the through-holes.

10. The control unit for electromechanical brake systems according to claim 2, wherein a thermal pad is provided between the energy storage cells and an inner wall of the housing.

11. The control unit for electromechanical brake systems according to claim 10, wherein a thermally conductive medium and/or a shock absorbing medium are provided between the braking energy storage module and the frame plate and/or between the brake system control module and the frame plate.

12. The control unit for electromechanical brake systems according to claim 11, wherein a voltage conversion module is further provided in the housing, the voltage conversion module and the brake system control module being arranged at the same side of the frame plate.

13. The control unit for electromechanical brake systems according to claim 12, wherein the braking energy storage module is in signal or electric connection with the brake system control module and/or the voltage conversion module via a bus passing through the frame plate.

14. The control unit for electromechanical brake systems according to claim 13, wherein the bus is supported on a dielectric stand, the dielectric stand being fixed to the frame plate.

15. The control unit for electromechanical brake systems according to claim 11, wherein the control unit further comprises an input connector configured for an external power supply to input power, and an output connector configured for outputting power to an electronic brake device.

16. The control unit for electromechanical brake systems according to claim 11, wherein a plurality of support units are provided in the housing, and through-holes are provided respectively in the frame plate, the braking energy storage module, and the brake system control module, whereby the frame plate, the braking energy storage module, and the brake system control module are stacked and fastened to the support units by bolts through the through-holes.

* * * * *